United States Patent
Zheng et al.

(10) Patent No.: US 9,455,045 B1
(45) Date of Patent: Sep. 27, 2016

(54) CONTROLLING OPERATION OF A TIMING DEVICE USING AN OTP NVM TO STORE TIMING DEVICE CONFIGURATIONS IN A RAM

(71) Applicant: Integrated Device Technology, Inc., San Jose, CA (US)

(72) Inventors: Xiaohong Zheng, San Jose, CA (US); Hui Li, Fremont, CA (US)

(73) Assignee: INTEGRATED DEVICE TECHNOLOGY, INC., San Jose, CA (US)

( * ) Notice: Subject to any disclaimer, the term of this patent is extended or adjusted under 35 U.S.C. 154(b) by 0 days.

(21) Appl. No.: 14/691,472

(22) Filed: Apr. 20, 2015

(51) Int. Cl.
*G11C 17/00* (2006.01)
*G11C 17/18* (2006.01)
*G11C 17/16* (2006.01)

(52) U.S. Cl.
CPC ............ *G11C 17/18* (2013.01); *G11C 17/16* (2013.01)

(58) Field of Classification Search
CPC ... G11C 11/5642; G11C 16/10; G11C 16/26; G11C 7/1006; G11C 11/408; G11C 11/4096; G11C 29/04; G11C 7/1072
USPC ................ 365/185.33, 189.011, 201, 230.01
See application file for complete search history.

(56) References Cited

U.S. PATENT DOCUMENTS

| | | |
|---|---|---|
| 4,862,485 A | 8/1989 | Guinea et al. |
| 5,663,105 A | 9/1997 | Sua et al. |
| 5,757,240 A | 5/1998 | Boerstler et al. |
| 5,903,195 A | 5/1999 | Lukes et al. |
| 6,219,797 B1 | 4/2001 | Liu et al. |
| 6,259,327 B1 | 7/2001 | Balistreri et al. |
| 6,640,311 B1 | 10/2003 | Knowles et al. |
| 6,650,193 B2 | 11/2003 | Endo et al. |
| 6,683,506 B2 | 1/2004 | Ye et al. |
| 6,727,767 B2 | 4/2004 | Takada et al. |
| 6,768,387 B1 | 7/2004 | Masuda et al. |
| 7,012,476 B2 | 3/2006 | Ogiso et al. |
| 7,323,916 B1 | 1/2008 | Sidiropoulos et al. |
| 7,405,594 B1 | 7/2008 | Xu et al. |
| 7,434,083 B1 | 10/2008 | Wilson et al. |
| 7,541,848 B1 | 6/2009 | Masuda et al. |
| 7,545,188 B1 | 6/2009 | Xu et al. |
| 7,573,303 B1 | 8/2009 | Chi et al. |
| 7,586,347 B1 | 9/2009 | Ren et al. |
| 7,590,163 B1 | 9/2009 | Miller et al. |

(Continued)

OTHER PUBLICATIONS

"19-Output PCIE GEN 3 Buffer", Si53019-A01A, Silicon Laboratories Inc., Rev. 1.1 May 2015, 34 Pages.

(Continued)

*Primary Examiner* — Thong Q Le
(74) *Attorney, Agent, or Firm* — Kenneth Glass; Glass & Associates

(57) ABSTRACT

The present invention provides a method and apparatus that includes a timing device circuit for generating a timing signal, a RAM coupled to the timing device circuit, an OTP NVM and selection logic. The RAM is operable upon receiving a burn address to read configuration data in the RAM beginning at the burn address and the OTP NVM is operable to burn the configuration data read from RAM into the OTP NVM. The OTP NVM is configured to read configuration data in the OTP NVM and the RAM is configured to store the configuration data from the OTP NVM beginning at an address in the RAM corresponding to a read start address to define a timing device configuration in the RAM.

19 Claims, 8 Drawing Sheets

(56) References Cited

U.S. PATENT DOCUMENTS

| | | |
|---|---|---|
| 7,671,635 B2 | 3/2010 | Fan et al. |
| 7,737,739 B1 | 6/2010 | Bi et al. |
| 7,741,981 B1 | 6/2010 | Wan et al. |
| 7,750,618 B1 | 7/2010 | Fang et al. |
| 7,786,763 B1 | 8/2010 | Bal et al. |
| 7,816,959 B1 | 10/2010 | Isik et al. |
| 7,907,625 B1 | 3/2011 | MacAdam et al. |
| 7,928,880 B2 | 4/2011 | Tsukamoto |
| 7,941,723 B1 | 5/2011 | Lien et al. |
| 8,018,289 B1 | 9/2011 | Hu et al. |
| 8,164,367 B1 | 4/2012 | Bal et al. |
| 8,179,952 B2 | 5/2012 | Thurston et al. |
| 8,259,888 B2 | 9/2012 | Hua et al. |
| 8,284,816 B1 | 10/2012 | Clementi et al. |
| 8,305,154 B1 | 11/2012 | Kubena et al. |
| 8,416,107 B1 | 4/2013 | Wan et al. |
| 8,436,677 B2 | 5/2013 | Kull et al. |
| 8,471,751 B2 | 6/2013 | Wang |
| 8,537,952 B1 | 9/2013 | Arora et al. |
| 8,693,557 B1 | 4/2014 | Zhang et al. |
| 8,704,564 B2 | 4/2014 | Hasegawa et al. |
| 8,723,573 B1 | 5/2014 | Wang et al. |
| 8,791,763 B2 | 7/2014 | Taghivand |
| 8,896,476 B2 | 11/2014 | Harpe |
| 8,933,830 B1 | 1/2015 | Jeon |
| 8,981,858 B1 | 3/2015 | Grivna et al. |
| 2002/0079937 A1 | 6/2002 | Xanthopoulos et al. |
| 2002/0191727 A1 | 12/2002 | Staszewski et al. |
| 2003/0042985 A1 | 3/2003 | Shibahara et al. |
| 2004/0136440 A1 | 7/2004 | Miyata et al. |
| 2004/0165691 A1 | 8/2004 | Rana et al. |
| 2006/0197614 A1 | 9/2006 | Roubadia et al. |
| 2006/0290391 A1 | 12/2006 | Leung et al. |
| 2007/0149144 A1 | 6/2007 | Beyer et al. |
| 2007/0247248 A1 | 10/2007 | Kobayashi et al. |
| 2008/0043893 A1 | 2/2008 | Nagaraj et al. |
| 2008/0104435 A1 | 5/2008 | Pernia et al. |
| 2008/0129351 A1 | 6/2008 | Chawla et al. |
| 2008/0246546 A1 | 10/2008 | Ha et al. |
| 2009/0083567 A1 | 3/2009 | Kim et al. |
| 2009/0140896 A1 | 6/2009 | Adduci et al. |
| 2009/0184857 A1 | 7/2009 | Furuta et al. |
| 2009/0231901 A1 | 9/2009 | Kim et al. |
| 2009/0256601 A1 | 10/2009 | Zhang et al. |
| 2009/0262567 A1 | 10/2009 | Shin et al. |
| 2010/0052798 A1 | 3/2010 | Hirai et al. |
| 2010/0090731 A1 | 4/2010 | Casagrande et al. |
| 2010/0164761 A1 | 7/2010 | Wan et al. |
| 2010/0194483 A1 | 8/2010 | Storaska et al. |
| 2010/0323643 A1 | 12/2010 | Ridgers et al. |
| 2011/0006936 A1 | 1/2011 | Lin et al. |
| 2011/0234433 A1 | 9/2011 | Aruga et al. |
| 2011/0285575 A1 | 11/2011 | Landez et al. |
| 2011/0304490 A1 | 12/2011 | Janakiraman |
| 2012/0161829 A1 | 6/2012 | Fernald et al. |
| 2012/0262315 A1 | 10/2012 | Kapusta et al. |
| 2012/0297231 A1 | 11/2012 | Qawami et al. |
| 2012/0317365 A1* | 12/2012 | Elhamias ............ G06F 12/0862 711/141 |
| 2012/0328052 A1 | 12/2012 | Etemadi et al. |
| 2013/0002467 A1 | 1/2013 | Wang |
| 2013/0162454 A1 | 6/2013 | Lin |
| 2013/0194115 A1 | 8/2013 | Wu et al. |
| 2013/0211758 A1 | 8/2013 | Prathapan et al. |
| 2014/0029646 A1 | 1/2014 | Foxcroft et al. |
| 2014/0210532 A1 | 7/2014 | Jenkins et al. |
| 2014/0327478 A1 | 11/2014 | Horng et al. |
| 2014/0347941 A1 | 11/2014 | Jose et al. |
| 2015/0162921 A1 | 6/2015 | Chen et al. |
| 2015/0180594 A1 | 6/2015 | Chakraborty et al. |
| 2015/0200649 A1 | 7/2015 | Trager et al. |

OTHER PUBLICATIONS

"NB3W1200L: 3.3 V 100/133 MHz Differential 1:12 Push-Pull Clock ZDB/Fanout Buffer for PCIe", ON Semiconductor, http://onsemi.com, Aug. 2013, Rev. 0, 26 Pages.

Avramov, et al., "1.5-GHz Voltage Controlled Oscillator with 3% Tuning Bandwidth Using a Two-Pole DSBAR Filter", Ultrasonics, Ferroelectrics and Frequency Control. IEEE Transactions on. vol. 58., May 2011, pp. 916-923.

Hwang, et al., "A Digitally Controlled Phase-Locked Loop with a Digital Ohase—Frequency Detector for Fast Acquisition", IEEE Journal of Solid State Circuits, vol. 36, No. 10, Oct. 2001, pp. 1574-1581.

Kratyuk, et al., "Frequency Detector for Fast Frequency Lock of Digital PLLs", Electronic Letters, vol. 43, No. 1, Jan. 4, 2007, pp. 1-2.

Mansuri, "Fast Frequency Acquisition Phase-Frequency Detectors for GSamples/s Phase-Locked Loops", IEEE Journal of Solid-State Circuits, vol. 37 No. 10, Oct. 2002, pp. 1331-1334.

Nagaraju, "A Low Noise 1.5GHz VCO with a 3.75% Tuning Range Using Coupled FBAR's", IEEE International Ultrasonics Symposium (IUS), Oct. 2012, pp. 1-4.

Watanabe, "An All-Digital PLL for Frequency Multilication by 4 to 1022 with Seven-Cycle Lock Time", IEEE Journal of Solid-State Circuits, vol. 39 No. 2, Feb. 2003, pp. 198-204.

Texas Instruments "CDCEx913 Programmable 1-PLL VCXO Clock Synthesizer With 1.8-V, 2.5-V, and 3.3-V Outputs", Apr. 2015, pp. 1-36, pp. 11, 20-22.

* cited by examiner

CONTROLLING OPERATION OF A TIMING DEVICE USING AN OTP NVM TO STORE TIMING DEVICE CONFIGURATIONS IN A RAM

BACKGROUND OF THE INVENTION

Programmable timing devices must have a basic set of configuration parameters at each power-on of the timing device in order to generate the required timing device output. Typically, at a power-on of a programmable timing device, typically referred to as a "power-on reset," the timing device receives a configuration at data interface control circuits of the timing device such as an Inter-IC ($I^2C$) interface or a system management bus (SMB) interface. This configuration is loaded into the timing device and is used to control the initial operation of the timing device.

In order to eliminate the need for receiving configuration data at each power-on reset, timing device have been developed that are configured to be connected to external read only memory (ROM) that includes the required timing device configuration. At power-on reset the timing device configuration from the external ROM is loaded into the timing device to control the initial operation of the timing device.

Though use of a timing device configuration stored in an external ROM eliminates the need to program a configuration into the timing device through the data interface control circuits at each power-on reset, there may be a need to use a different configuration from the timing device configuration stored in the external ROM. To meet this need a one-time programmable non-volatile memory (OTP NVM) can be added to the timing device to allow for use of different configurations without requiring programming of a configuration into the timing device through the data interface control circuits at each power-on reset. However, conventional data structures in the OTP and in the RAM limit the flexibility of the system. Hence, there is a need for a method and apparatus that will provide more flexibility in the configuration of the timing device.

SUMMARY OF THE INVENTION

The present invention provides a method for configuring a timing device that includes the step of receiving input at the timing device, the input including a start address and a end address. When the input includes a burn address, reading configuration data from a Random Access Memory (RAM) beginning at an address in the RAM corresponding to the burn address and burning the configuration data read from RAM into a one time programmable non volatile memory (OTP NVM) at a location in the OTP NVM corresponding to the start address and the end address. When the input includes a read start address, reading the configuration data from the OTP NVM beginning at a location in the OTP NVM corresponding to the start address and ending at a location in the OTP NVM corresponding to the end address and storing the configuration data read from the OTP NVM into the RAM beginning at an address in the RAM corresponding to the read start address.

A timing device is disclosed that includes selection logic configured for receiving input data that includes a burn address, a start address and an end address and configured for receiving additional input data that includes a read start address, a start address and an end address. The timing device also includes a Random Access Memory (RAM) coupled to the selection logic, the selection logic operable upon receiving the input data to couple the burn address to the RAM and the RAM operable upon receiving the burn address to read configuration data beginning at an address in the RAM corresponding to the burn address.

The timing device includes a one time programmable non volatile memory (OTP NVM) coupled to the selection logic and to the RAM, the OTP NVM operable to receive the configuration data read from the RAM and operable to burn the configuration data read from RAM into the OTP NVM so as to store configuration data in the OTP NVM, the OTP NVM configured to read the configuration data in the OTP NVM defined by the additional input data and the RAM configured to store the configuration data from the OTP NVM defined by the additional input data beginning at an address in the RAM corresponding to the read start address of the additional input data to define a first timing device configuration in the RAM. Furthermore, the timing device includes a timing device circuit coupled to the RAM and operable using the first timing device configuration to generate a timing signal.

The methods and apparatus of the present invention allow for loading a configuration data from OTP NVM into any location in RAM, wherein the OTP NVM addresses are not required to match the RAM addresses, and thereby providing the user of the timing device added flexibility as compared to timing devices that only allow for loading a timing device configuration into a matching data address in RAM.

DESCRIPTION OF THE INVENTION

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one of ordinary skill in the art that the present invention may be practiced without these specific details. In other instances, well-known methods, procedures, components, and circuits have not been described in detail so as not to unnecessarily obscure aspects of the present invention.

Figure 1:
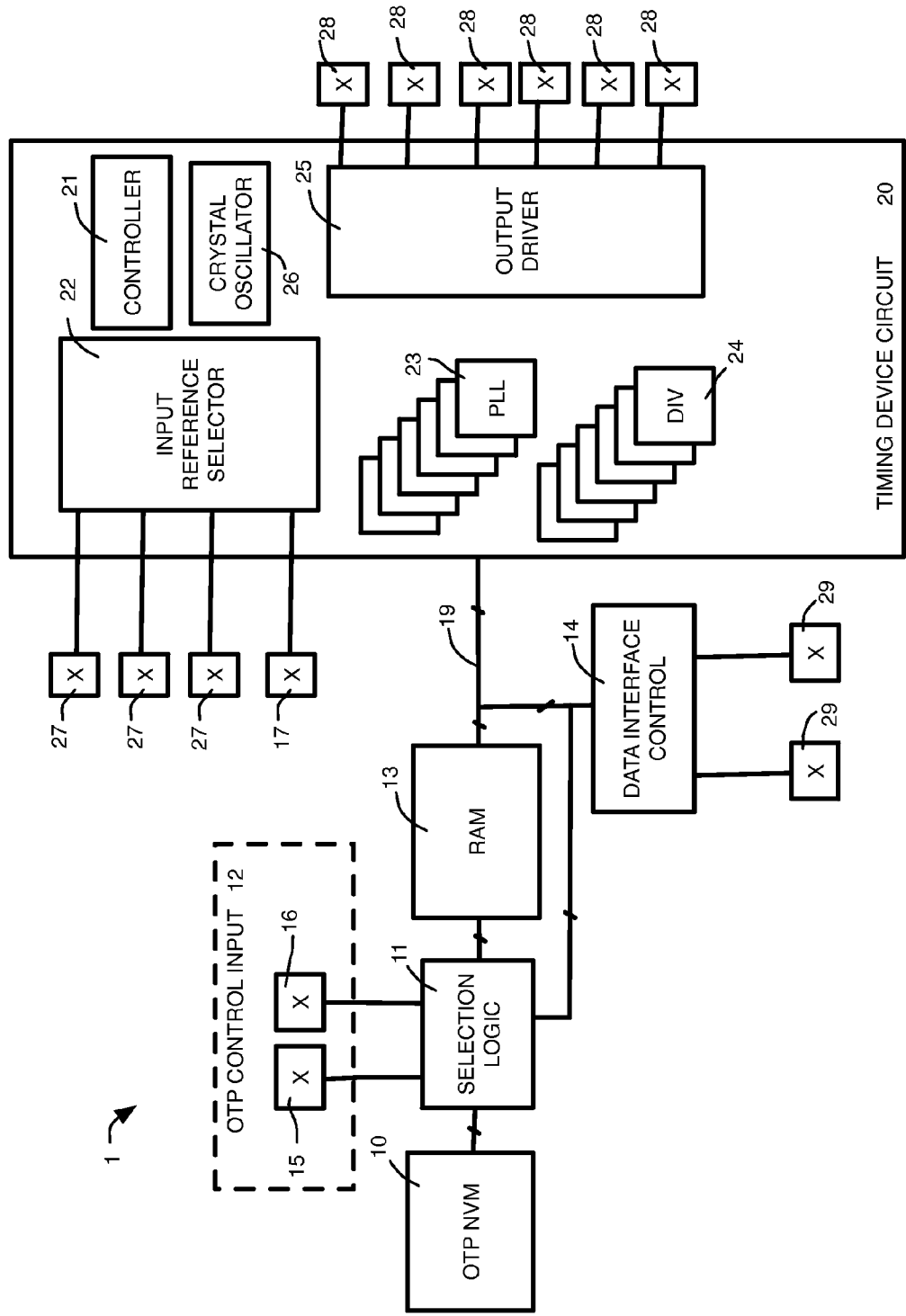
FIG. 1 is an illustration of a timing device in accordance with an embodiment of the present invention.

FIG. 1 illustrates a Timing device 1 includes OTP NVM 10 and RAM 13 that are coupled to selection logic 11. Timing device 1 also includes inputs 29 that are coupled to a data interface control circuit 14 for providing external input to timing device 1. Data interface control circuit 14 is coupled to RAM 13, to timing device circuit 20 and selection logic 11 by internal data bus 19. Data interface control circuit 14 can be an Inter-IC (I²C) interface or a system management bus (SMB) interface that allows for coupling data to timing device circuit 20, RAM 13 and selection logic 11 via inputs 29. In some embodiments (not shown) internal data bus 19 also connects directly to OTP NVM 10.

In the present embodiment OTP NVM 10 is a non-volatile memory array that includes programmable fuses and/or antifuses that can be programmed for one-time-storage in the OTP NVM memory array. In the present embodiment OTP NVM 10 includes programming logic coupled to the programmable fuses that selectively applies a high voltage to the programmable fuses during programming so as to "burn" the configuration data into OTP NVM 10.

Selection logic 11 is configured for receiving OTP-burn input that includes a burn address, a start address and an end address at one or more of contact pads 15a-16 of OTP control input 12 or at contact pad 29. RAM 13 is coupled to selection logic 11. Selection logic 11 is operable upon receiving the input data to couple the burn address to RAM 13 and RAM 13 is operable upon receiving the burn address to read configuration data beginning at an address in the RAM corresponding to the burn address.

OTP NVM 10 is operable to receive the configuration data read from RAM 13 and is operable to burn the configuration data read from RAM 13 into the OTP NVM 10 at a location in the OTP NVM corresponding to the start address and the end address of the input data so as to store configuration data in the OTP NVM. The process of receiving input data, reading configuration data from RAM and burning the configuration data read from the RAM can be repeated to subsequently burn additional data into OTP NVM 10.

In the present embodiment timing device 1 is configured for receiving OTP-read input that includes a read start address, a start address and an end address. OTP NVM 10 is configured to read the configuration data in the OTP NVM 10 defined by the OTP-read input. RAM 13 is configured to store the configuration data from the OTP NVM 10 defined by the OTP-read input beginning at an address in RAM 10 corresponding to the read start address of the OTP-read input. In addition, RAM 13 is configured to repeat the receiving OTP-read input data at the timing device, reading the configuration data from the OTP NVM defined by the OTP-read input data and storing the configuration data from the OTP NVM defined by the OTP-read input into the RAM to define a timing device configuration in the RAM.

Timing device circuit 20 is coupled to the RAM 10 and is operable using the timing device configuration stored in RAM 10 to generate timing signals at timing device outputs 28. In the embodiment shown in FIG. 4, timing device circuit 20 is shown to include a crystal oscillator 26 and a controller 21 that is operable for controlling the operation of the timing device circuit. Crystal oscillator 26 is programmable and can be coupled to an external timing device crystal such as an inexpensive fundamental-mode quartz crystal to provide timing device frequency synthesis. Timing device circuit 20 includes inputs 27, phase lock loop circuits 23 that are individually programmable to provide up to seven different frequencies, frequency dividers 24 and output driver 25 for generating at each timing device output 28 an output timing signal. Timing device circuit 20 also includes an input reference selector 17 for selecting one or more of inputs 27 for use in generating one or more of the output timing signals.

It is appreciated that timing device circuit 20 may or may not include all of the features shown in FIG. 1, depending on the intended use of timing device circuit 20. In one embodiment, some of inputs 27 and input reference selector 17, phase lock loops circuits 23 and frequency dividers 24 are optional and may or may not be included in timing device circuit 20, depending on the required timing device output. Also, other programmable features and non-programmable features may be included in timing device circuit 20 that are known in the art such as, for example, clock synthesizer circuits for generating programmed output frequencies, dynamic phase adjustment circuits for controlling the phase of one or more of the output timing signals relative to an input sync signal that may be received at, for example input 27 or one of inputs 29, voltage controlled oscillator circuits, SAW oscillator circuits, programmable loop bandwidth circuits, programmable slew rate control circuits, divider programming with FEC and DFEC look-up tables, frequency tuning circuits for tuning single or multiple frequencies by a VIN control pin, etc. In one specific embodiment timing device circuit 20 includes non-PLL fan-out buffers, clock synthesizers and muxes, single-ended timing device input to programmable differential timing device outputs, zero-delay buffers, programmable PLL bandwidth for device cascading, and jitter attenuators.

Figure 2:
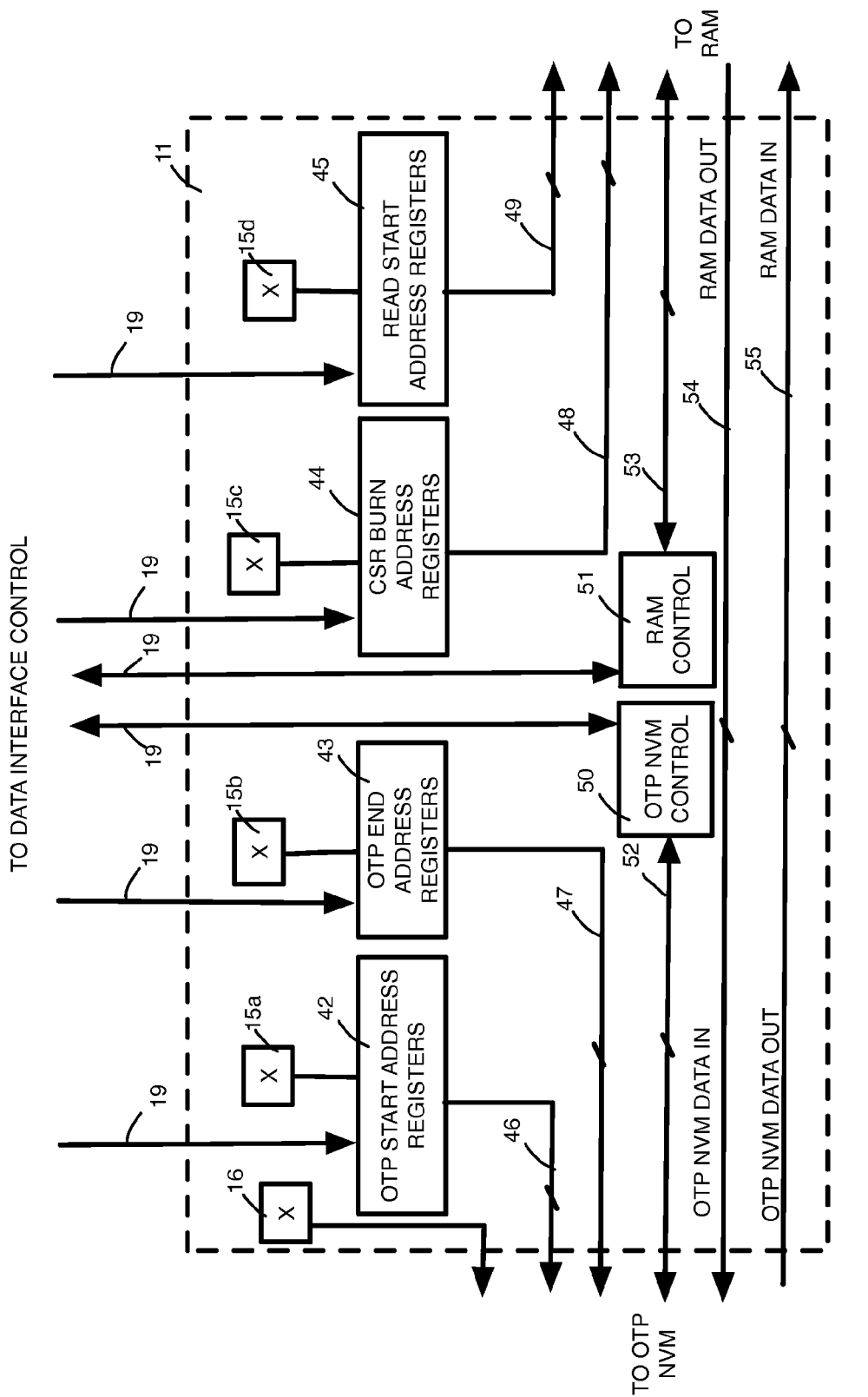
FIG. 2 is a block diagram illustrating selection logic in accordance with an embodiment of the present invention.

FIG. 2 shows an exemplary embodiment of selection logic 11 in which OTP-burn input data OTP-read input data and OTP-read input data is stored in registers 42-45. More particularly, selection logic 11 includes OTP start address registers 42 that connect to bus 19 and that connect to input 15a. OTP end address registers 43 connect to bus 19 and connect to input 15b. CSR-burn address registers 44 connect to bus 19 and connect to input 15c. Similarly, read start address registers 45 connect to bus 19 and connect to input 15d. Inputs 15a-15d may be, for example, contact pads of timing device 1 that are configured to receive input such as OTP-burn input and configure-RAM input. It can be seen that input may be directly coupled to selection logic 14 through inputs 15a-15d or may be input to selection logic 14 through inputs 29, data interface control 14 and bus 19. In alternate embodiments, registers 42-45 only couple to bus 19 and selection logic 11 does not include inputs 15a-15d; or, alternatively, registers 42-45 only couple to inputs 15a-15d and do not couple to bus 19.

In the present embodiment selection logic 14 includes RAM control circuitry 51 that connects to other circuitry of timing device 1 through bus 19. Interconnect 53 connects RAM control circuitry to RAM 13 and allows for messages and instructions to be sent between RAM control circuitry 51 and RAM 13. When a read or write of RAM 13 is to be performed RAM control circuitry 51 sends input to RAM 13 instructing RAM 13 to perform the read or write operation. The input may be, for example, a logical high on one of interconnects 53 or one or more instruction.

In the present embodiment selection logic 11 includes OTP NVM control circuitry 50 that is coupled to bus 19. Interconnect 52 connects OTP NVM control circuitry 50 to OTP NVM 10 and allows for messages and instructions to be coupled between OTP NVM control circuitry 50 and OTP NVM 10.

Figure 5:
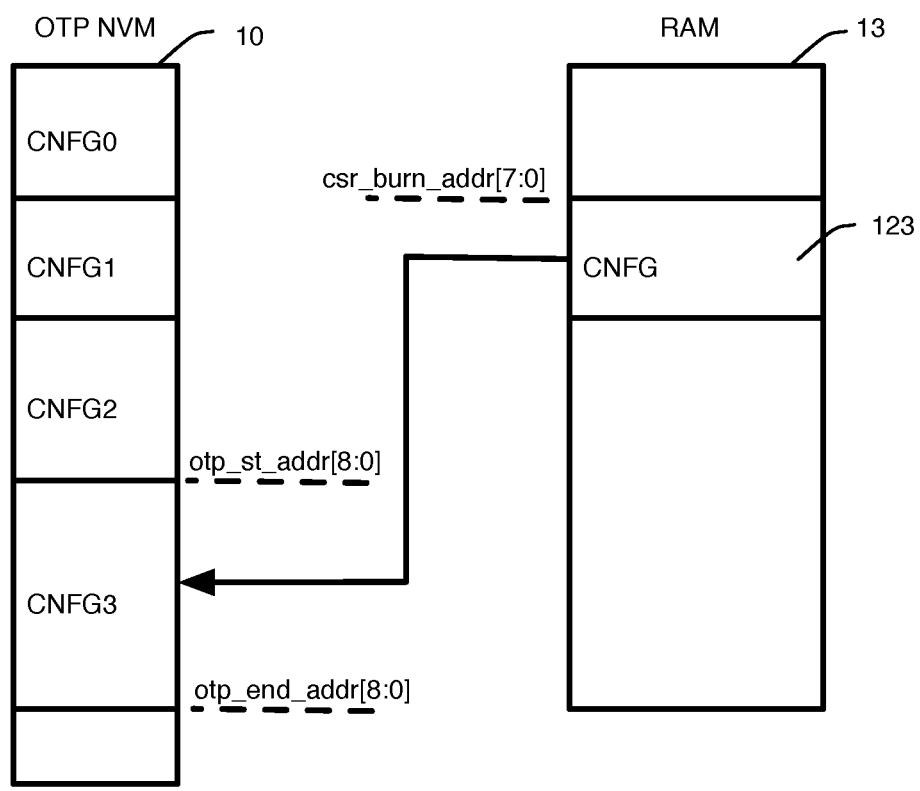
FIG. 5 is a block diagram showing a portion of a timing device that illustrates storing configuration data in an OTP NVM in accordance with an embodiment of the present invention.

Though FIG. 2 shows a separate interconnect 48 for coupling the burn address to RAM 13 and a separate interconnect 49 for coupling the read start address to RAM 13 it is appreciated that, alternatively, CSR burn address registers 44 and read start address registers 45 could be coupled to RAM 13 through RAM control circuitry 51. Though FIG. 5 shows a separate interconnect 46 for coupling the OTP start address registers 42 to OTP NVM 10 and a separate interconnect 47 for coupling the OTP end address registers 43 to OTP NVM 10 it is appreciated that, alternatively, OTP start address registers 42 and OTP end address registers 43 could be coupled to OTP NVM 10 through OTP NVM control circuitry 50.

OTP start address registers 42 and OTP end address registers 43 could be coupled to OTP NVM 10 through OTP NVM control circuitry 50.

Figure 3:
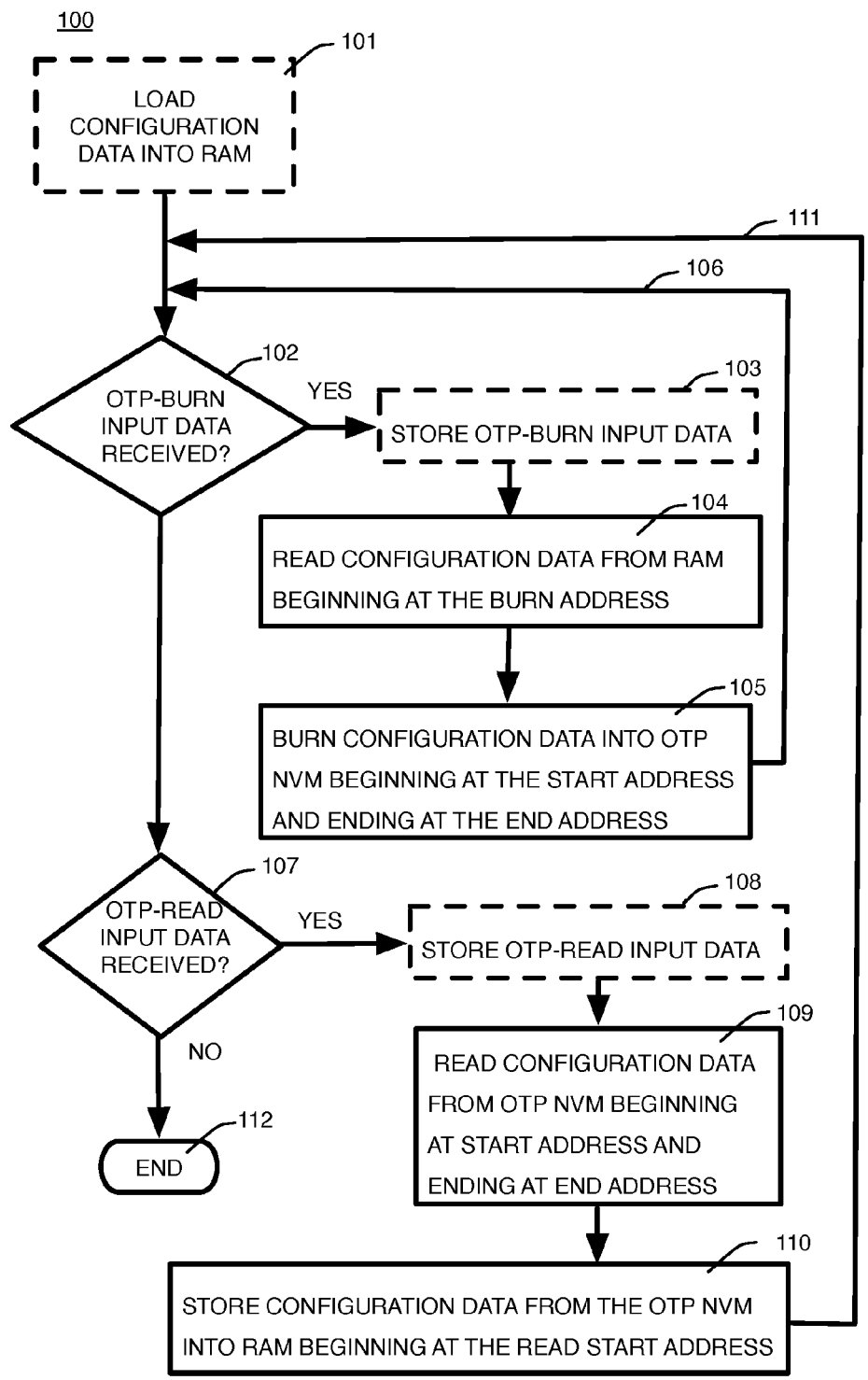
FIG. 3 is a block diagram illustrating a method for controlling operation of a timing device in accordance with an embodiment of the present invention.

FIG. 3 illustrates a method 100 for controlling operation of a timing device. Referring now to step 101, configuration data is loaded into RAM 13 when an OTP NVM burn is to be performed. In the embodiment shown in FIG. 1, upon power-on restart, configuration data that is received at inputs 29 is stored in RAM 13. Step 101 is optional as configuration data may not need to be loaded into ram when OTP NVM is not being burned.

When OTP-burn input data is received at a timing device the OTP-burn input data may optionally be stored as shown by steps 102-103. In the present embodiment OTP-burn input data includes a burn address, a start address and an end address. In the embodiment shown in FIG. 2 the burn address is stored in CSR burn address registers 44, the start address is stored in OTP start address registers 42, the end address is stored in OTP end address registers 43.

As shown by step 104 configuration data is read from a RAM 13 beginning at an address in the RAM corresponding to the burn address. In the embodiment shown in FIG. 2 the burn address is sent to RAM 10 over interconnect 48. RAM control circuitry 51 sends input to RAM 13 instructing RAM 13 to perform the read operation and the results of the read operation are coupled to OTP NVM 10 via interconnect 54.

As shown by step 105 the configuration data read from RAM is burned into OTP NVM 10 at a location in OTP NVM 10 corresponding to the start address and the end address. In the embodiment shown in FIG. 2 the OTP start address is sent to OTP NVM 10 over interconnect 46, the OTP end address is sent to OTP NVM over interconnect 47 and OTP NVM control circuitry 50 sends input to OTP NVM 10 instructing OTP NVM 10 to perform the burn operation. This input may be, for example, a logical high on one of interconnects 52 or an instruction. In the present embodiment, during programming OTP NVM receives a programming voltage that is higher than the normal operating voltage of OTP NVM 10 through input 16 that may be, for example a contact pad of timing device 1.

The process continues as shown by arrow 106 to burn some or all of the memory storage locations in the OTP NVM 10 to store configuration data into OTP NVM 10. In one embodiment steps 102-105 are performed a single time to burn OTP NVM 10. In other embodiments steps 102-105 are repeated so as to store configuration data in OTP NVM 10. For example, steps 102-105 may be performed to store one or more initial configuration and steps 102-105 may later be repeated to store one or more additional configuration in OTP NVM 10.

When OTP-read input data is received at a timing device 1 the OTP-read input data may optionally be stored as shown by steps 107-108. In the present embodiment OTP-read input data includes a read start address, a start address and an end address. In the embodiment shown in FIG. 2 the read start address is stored in read start address registers 45, the start address is stored in OTP start address registers 42 and the end address is stored in OTP end address registers 43.

As shown in step 109 the configuration data is read from the OTP NVM 10 beginning at a location in OTP NVM 10 corresponding to the start address and ending at a location in the OTP NVM corresponding to the end address. In the embodiment shown in FIG. 2, the OTP start address and the OTP end address are sent to OTP NVM 10. OTP NVM control circuitry 50 sends input to OTP NVM 10 instructing OTP NVM 10 to perform the read operation and the results of the read operation are coupled to RAM 13 via interconnect 55.

As shown by step 110 the configuration data read from the OTP NVM is stored in the RAM beginning at an address in the RAM corresponding to the read start address 110. In the embodiment shown in FIG. 2, the read start address is sent to RAM 13 over interconnect 55 and RAM control circuitry 51 sends input to RAM 13 instructing RAM 13 to perform the write operation.

As shown by line 111 the method returns to step 102. The method ends at step 112.

Figure 4:
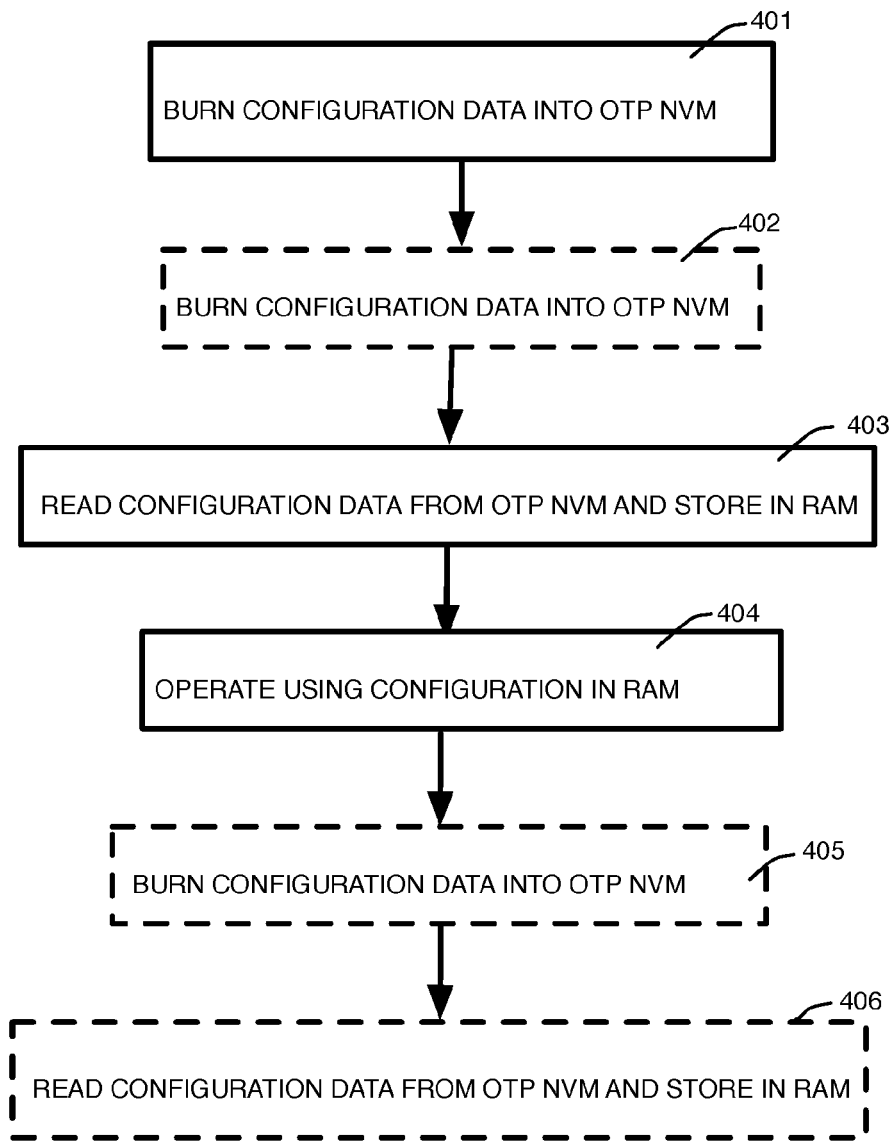
FIG. 4 is a block diagram illustrating a method for controlling operation of a timing device in accordance with an embodiment of the present invention.

FIG. 4 shows a method 400 for controlling the operation of a timing device. As shown by step 401, configuration data is burned into an OTP NVM 10. Configuration data can be burned into the OTP NVM 10 by performing steps 102-105 of FIG. 3.

In the embodiment shown in FIG. 5, step 401 is operable to burn some of the memory storage locations in OTP NVM 10 so as to store contiguous configuration data defining a first timing device configuration (CNFG0), contiguous configuration data defining a second timing device configuration (CNFG1), contiguous configuration data defining a third timing device configuration (CNFG2), and contiguous configuration data defining a fourth timing device configuration (CNFG3). In FIG. 5 the burning of the fourth timing device configuration is illustrated, showing reading configuration data from RAM 13 beginning the burn address (csr_burn_addr) and burning the configuration data read from RAM 13 into OTP NVM 10 beginning at start address (otp_st_addr) and ending at end address (otp_end_addr).

Figure 6A:
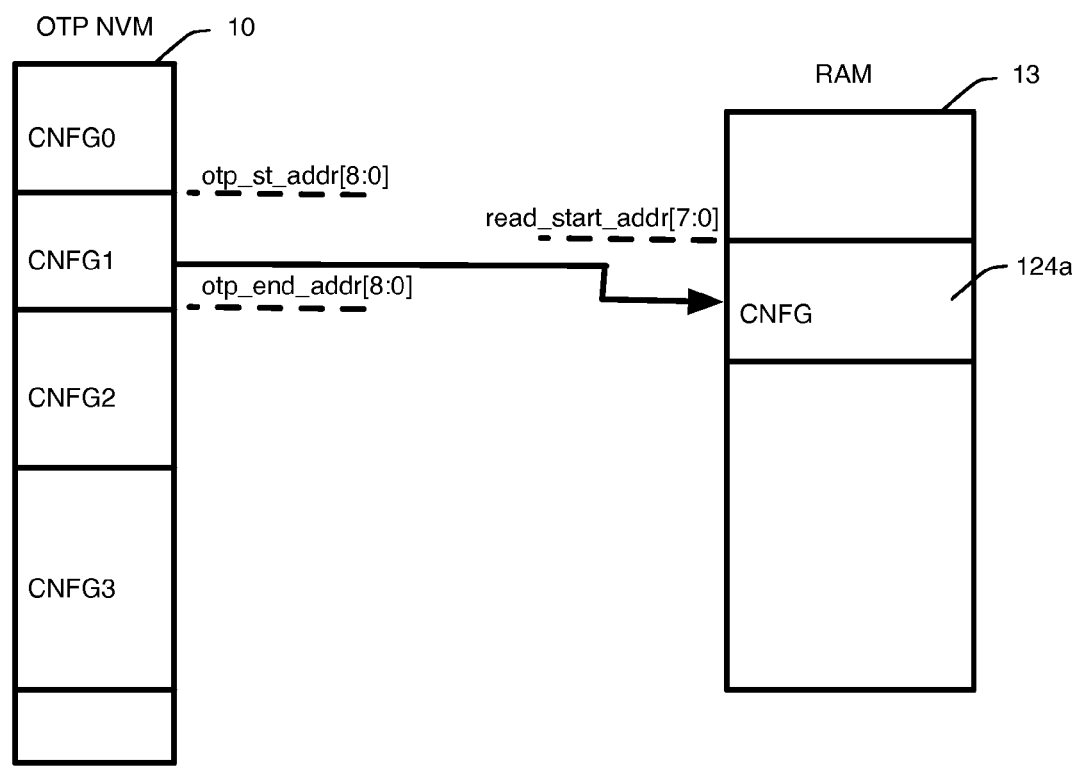
FIG. 6A is a block diagram showing a portion of a timing device that illustrates reading configuration data from a OTP NVM and storing the configuration data in a RAM in accordance with an embodiment of the present invention.
Figure 6B:
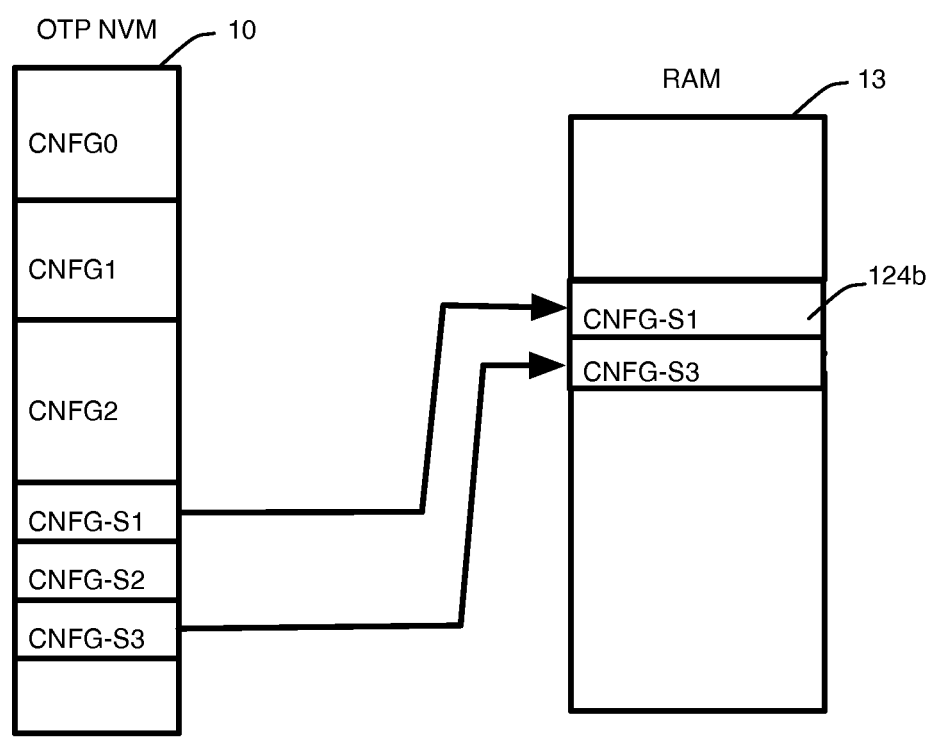
FIG. 6B is a block diagram showing a portion of a timing device that includes a OTP NVM in which configuration segments and complete contiguous configurations have been burned and illustrates storing two of the configuration segments in a RAM in accordance with an embodiment of the present invention.
Figure 6C:
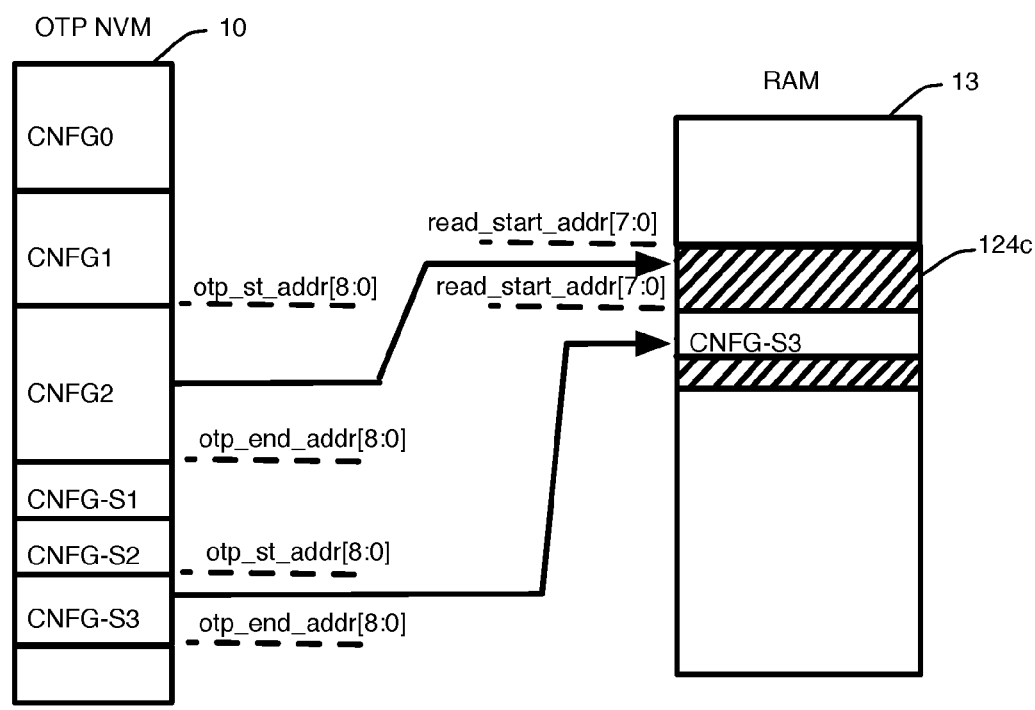
FIG. 6C is a block diagram showing a portion of a timing device that illustrates reading configuration data from a OTP NVM and storing a complete contiguous configuration followed by storing a configuration segment in a RAM such that the configuration segment overwrites a portion of the complete contiguous configuration in accordance with an embodiment of the present invention.

The configuration data may include complete contiguous configurations as shown in FIGS. 5 and 6A (e.g., CNFG0, CNFG1, CNFG2, CNFG3) or a combination of complete contiguous configurations and configuration segments as shown in FIGS. 6B-6C. More particularly, in the embodiment shown in FIGS. 6B-6C the configuration data stored in OTP NVM 10 includes both contiguous configuration data that defines a complete configuration, shown as complete contiguous configurations CNFG0, CNFG1 and CNFG2 and configuration segments CNFG-S1, CNFG-S2 and CNFG-S3. The term "configuration segment" as used in the present invention refers to configuration data that defines less than a complete configuration. Configuration segments may define one or more features not included in one or more complete contiguous configuration CNFG0, CNFG1 and CNFG2 and some or all of configuration segments CNFG-S1, CNFG-S2 and CNFG-S3 may be modular portions that are combined to form a complete configuration.

Optionally, configuration data is again burned into OTP NVM 10 as shown by step 402. This can be done by performing steps 102-105 one or more times to store a timing device configuration that is different from the timing device configuration stored in step 401. Step 402 can be performed when an additional complete contiguous configurations or a configuration segment needs to be added. For example, timing device 1 can be delivered to the customer who performs step 401 so as to burn one or more complete contiguous configuration and one or more configuration segment in OTP NVM 10 Alternatively, the manufacturer of timing device 1 can perform step 401 prior to delivery of the timing device 1 to a customer so as to include one or more default timing device configuration on the timing device 1 when it is delivered to the customer, leaving storage space in the timing device 1 for the customer to burn additional configuration data. The customer can then perform step 402 as needed to burn additional complete contiguous configurations or configuration segments into OTP NVM.

Configuration data is then read from OTP NVM 10 and stored in RAM 13 as shown by step 403. In the present embodiment step 403 is performed after each power-on-restart to define the desired timing device configuration in RAM 13, followed by normal operation of the timing device using the configuration stored in RAM 13 in step 403 as shown by step 404.

In one embodiment step 403 includes performing steps 107-110 once to install a complete contiguous configuration in RAM 13. An example of this is shown in FIG. 6A where the storage of the second timing device configuration (CNFG1) into RAM 13 is illustrated. In this embodiment configuration data is read from OTP NVM 10 beginning at start address (otp_st_addr) and ending at end address (otp_end_addr) and the configuration data read from OTP NVM 10 is stored into RAM 13 beginning at the read start address (read_start_addr) to define a timing device configuration 124a in RAM 13.

In one embodiment step 403 includes repeating steps 107-110 to form a complete timing device configuration. An example of this is shown in FIG. 6B where a first iteration of steps 107-110 is performed to store configuration segment CNFG-S1 into RAM 13. A second iteration of steps 107-110 then stores configuration segment CNFG-S3 to define a timing device configuration 124b in RAM 13.

In one embodiment step 403 includes repeating steps 107-110 to overwrite portions of the timing device configuration saved in the previous step 107-110. An example of this is shown in FIG. 6C where a first iteration of steps 107-110 is performed to store the timing device configuration (CNFG2) into RAM 13. A second iteration of steps 107-110 then stores configuration segment CNFG-S3 such that CNFG-S3 partially overwrites a portion of CNFG2 to define a timing device configuration 124c in RAM 13.

After operation of timing device 120 using the timing device configuration stored in RAM in step 403, the timing device configuration can be changed by burning additional configuration data in the OTP NVM as shown by step 405 followed by reading the configuration data from the OTP NVM and storing it in RAM as shown by step 406. More particularly, the new configuration or configuration segment that is burned in step 405 can be stored in RAM in step 406.

It is appreciated that step 405 is optional and that, after operation of timing device 1 using the timing device configuration stored in RAM 13 in step 403, the timing device configuration can be changed simply by reading configuration data from OTP NVM and storing it in RAM as shown by step 406. More particularly, a complete contiguous configuration and/or one or more configuration segment can be read from OTP NVM 10 and stored to form a timing device configuration that is different from the timing device configuration stored in step 403.

The timing device configuration stored in step 406 may be formed by performing steps 107-110 to change the timing device configuration to a different timing device configuration by overwriting a portion of the timing device configuration stored in step 403 with a configuration segment as illustrated in FIG. 6C to add a feature or change a characteristic of the initial timing device configuration, or by overwriting the entire timing device configuration stored in step 403.

It is appreciated that programmable timing device circuit 20 can have any of a number of different designs and may be specialized for any of a number of different purposes. In one embodiment the loaded timing device configuration includes skew parameters for controlling skew of one or more of the plurality of output timing signals. The loaded timing device configuration can also include output frequency parameters for controlling the frequency of the plurality of output timing signals. Moreover, the loaded timing device configuration can include output format parameters for controlling the output format of the output timing signals. The output format parameters can indicate, for example LVPECL, LVDS, HCSL, CML, HSTL, or other selectable outputs. The loaded timing device configuration also includes parameters for controlling one or more of phase lock loop circuits 23 and parameters for controlling one or more of frequency dividers 24.

In the present embodiment, timing device 1 is an Application-Specific Integrated Circuit (ASIC) formed on a single semiconductor die. Accordingly, the timing device circuit 20, the RAM 13, OTP NVM 10 and selection logic 1 are disposed on a single semiconductor die.

As is known in the art, the methods and apparatus of the present invention may be implemented in a Field Programmable Gate Array (FPGA), an Application-Specific Integrated Circuit (ASIC) or a variety of other commonly known integrated circuit devices. The implementation of the invention may include both hardware and software components. For example, processes, actions and steps described in the present application can be performed by instructions performed on controller 21 such as, for example, one or more of the steps of method 100. Furthermore, though interconnects 54-55 are shown for coupling data between OTP NVM 10 and RAM 13, alternatively bus 19 could be used. Also, in embodiments of the present invention some or all of the functions of OTP NVM control circuit 50 and RAM control circuit 51 could be performed by other circuitry of timing device 1 such as, for example, controller 21 and/or a dedicated RAM controller.

The methods and apparatus of the present invention allow for loading a configuration from OTP NVM into any location in RAM, providing the user of the timing device added flexibility as compared to timing devices that only allow for loading a timing device configuration into a matching data address in RAM.

The term "OTP-burn input," as used in the present application is input that indicates that an OTP burn is to be performed and indicates a location in the RAM where the information to be burned can be found, and specifically includes a received input that includes a burn address, a start address and an end address. The term "OTP-read input," as used in the present application is input that indicates that an OTP read is to be stored in RAM and indicates a location in the OTP NVM where the information to be read can be found, and specifically includes any received input that includes a read start address, a start address and an end address.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the Claims appended hereto and their equivalents.

We claim:

1. A method for controlling operation of a timing device comprising:
    receiving input at the timing device, the input including a start address and an end address;
    when the input includes a burn address, reading configuration data from a Random Access Memory (RAM) beginning at an address in the RAM corresponding to the burn address and burning the configuration data read from RAM into a one time programmable non volatile memory (OTP NVM) at a location in the OTP NVM corresponding to the start address and the end address; and
    when the input includes a read start address, reading the configuration data from the OTP NVM beginning at a location in the OTP NVM corresponding to the start address and ending at a location in the OTP NVM corresponding to the end address and storing the configuration data read from the OTP NVM into the RAM beginning at an address in the RAM corresponding to the read start address.

2. The method of claim 1 wherein the burning the configuration data read from RAM stores a plurality of configuration segments in the OTP NVM and wherein the storing the configuration data read from the OTP NVM stores some of the configuration segments of the plurality of configuration segments in the RAM to define a first timing device configuration.

3. The method of claim 2 further comprising initiating operation of the timing device using the first timing device configuration, and wherein the method further comprises:
    receiving a plurality of inputs including a read start address after the initiating operation of the timing device such that the storing the configuration data read from the OTP NVM stores at least one of the configuration segments of the plurality of configuration segments into RAM that was not included in the first timing device configuration so as to define a second timing device configuration that is different from the first timing device configuration.

4. The method of claim 3 further comprising restarting operation of the timing device using the second timing device configuration.

5. The method of claim 4 wherein the second timing device configuration enables a feature that was not included in the first timing device configuration.

6. The method of claim 4 wherein the receiving a plurality of inputs including a read start address after the initiating operation of the timing device and the storing the configuration data received from the OTP NVM completely overwrites the first timing device configuration.

7. A method for configuring a timing device comprising:
    burning configuration data into a one time programmable non volatile memory (OTP NVM);
    receiving input data at the timing device, the input data including a read start address, a start address and an end address;
    reading the configuration data from the OTP NVM defined by the input data;
    storing the configuration data from the OTP NVM defined by the input data into the RAM beginning at an address in the RAM corresponding to the read start address of the input data to define a first configuration in the RAM;
    operating the timing device using the first configuration;
    receiving additional input data at the timing device after the initiating operation of the timing device, the additional input data including a read start address, a start address and an end address;
    reading the configuration data from the OTP NVM defined by the additional input data; and
    storing the configuration data from the OTP NVM defined by the additional input data into the RAM beginning at an address in the RAM corresponding to the read start address of the additional input data to define a second configuration in the RAM that is different from the first configuration.

8. The method of claim 7 wherein the burning configuration data into a OTP NVM further comprises:
    receiving input data at a timing device, the input data including a burn address, a start address and an end address;
    reading configuration data from a Random Access Memory (RAM) beginning at an address in the RAM corresponding to the burn address; and
    burning the configuration data read from RAM into a one time programmable non volatile memory (OTP NVM) at a location in the OTP NVM corresponding to the start address and the end address so as to store configuration data in the OTP NVM.

9. The method of claim 7
    wherein operating the timing device using the first configuration further comprises operating the timing device using the first configuration to generate one or more output clock signal.

10. The method of claim 1 further comprising operating the timing device to generate one or more output clock signal.

11. The method of claim 7 further comprising repeating the steps of receiving additional input data at the timing device, reading the configuration data from the OTP NVM defined by the additional input data and storing the configuration data from the OTP NVM defined by the additional input data into the RAM to define a third configuration in the RAM that is different from the second configuration.

12. The method of claim 7 wherein the second configuration includes a configuration segment that enables a feature that was not included in the first configuration.

13. A timing device comprising:
    selection logic configured for receiving input data that includes a burn address, a start address and an end address and configured for receiving additional input data that includes a read start address, a start address and an end address;

a Random Access Memory (RAM) coupled to the selection logic, the selection logic operable upon receiving the input data to couple the burn address to the RAM and the RAM operable upon receiving the burn address to read configuration data beginning at an address in the RAM corresponding to the burn address;

a one time programmable non volatile memory (OTP NVM) coupled to the selection logic and to the RAM, the OTP NVM operable to receive the configuration data read from the RAM and operable to burn the configuration data read from RAM into the OTP NVM so as to store configuration data in the OTP NVM, the OTP NVM configured to read the configuration data in the OTP NVM defined by the input data and the RAM configured to store the configuration data from the OTP NVM defined by the input data beginning at an address in the RAM corresponding to the read start address of the input data to define a first timing device configuration in the RAM; and a timing device circuit coupled to the RAM and operable using the first timing device configuration to generate a timing signal.

14. The timing device of claim 13 wherein the timing device is configured for repeating the receiving additional input data at the timing device, reading the configuration data from the OTP NVM defined by the input data and storing the configuration data from the OTP NVM defined by the input data into the RAM.

15. The timing device of claim 13 wherein the reading the configuration data from the OTP NVM defined by the input data further comprises reading the configuration data from the OTP NVM beginning at a location in the OTP NVM corresponding to the start address of the input data and ending at a location in the OTP NVM corresponding to the end address of the input data.

16. The timing device of claim 13 wherein the selection logic is configured to receive additional input data including a read start address, a start address and an end address, the OTP NVM is configured to read the configuration data in the OTP NVM defined by the additional input data and the RAM is configured to store the configuration data from the OTP NVM defined by the additional input data into the RAM beginning at an address in the RAM corresponding to the read start address of the additional input data, the configuration data from the OTP NVM defined by the additional input data overwriting at least a portion of the first timing device configuration so as to define a second timing device configuration in the RAM that is different from the first timing device configuration.

17. The timing device of claim 16 wherein the second timing device configuration enables a feature that is not included in the first timing device configuration.

18. The timing device of claim 16 wherein the configuration data from the OTP NVM defined by the additional input data completely overwrites the first timing device configuration.

19. The timing device of claim 13 wherein the RAM, the OTP NVM, the selection logic and the timing device circuit are formed on a single semiconductor die.

\* \* \* \* \*